United States Patent
Kakizawa et al.

(10) Patent No.: US 6,716,803 B2
(45) Date of Patent: Apr. 6, 2004

(54) CLEANING AGENT FOR A SEMI-CONDUCTOR SUBSTRATE

(75) Inventors: Masahiko Kakizawa, Saitama (JP); Ken-ichi Umekita, Saitama (JP); Ichiro Hayashida, Saitama (JP)

(73) Assignee: Wako Pure Chemcial Industries, Ltd., Osaka (JP)

( * ) Notice: Subject to any disclaimer, the term of this patent is extended or adjusted under 35 U.S.C. 154(b) by 97 days.

(21) Appl. No.: 09/923,962

(22) Filed: Aug. 8, 2001

(65) Prior Publication Data

US 2002/0016272 A1 Feb. 7, 2002

Related U.S. Application Data

(62) Division of application No. 09/712,904, filed on Nov. 16, 2000, now Pat. No. 6,534,458, which is a division of application No. 09/610,657, filed on Jul. 5, 2000, now Pat. No. 6,310,019.

(51) Int. Cl.$^7$ .............................................. H01L 21/461
(52) U.S. Cl. ........................ 510/175; 510/176; 510/177; 134/3
(58) Field of Search ................................. 510/175, 176, 510/177; 134/2, 3, 6, 42; 438/725, 455

(56) References Cited

U.S. PATENT DOCUMENTS 5,466,389 A * 11/1995 Ilardi et al. ................. 510/175
6,261,745 B1 * 7/2001 Tanabe et al. ............... 430/331
6,310,019 B1 * 10/2001 Kakizawa et al. .......... 510/175
6,534,458 B1 * 3/2003 Kakizawa et al. .......... 510/175

OTHER PUBLICATIONS

Derwent Abstract for JP–A 10–72594 (Mar. 17, 1998).
Derwent Abstract for JP–A 10–321576 (Dec. 4, 1998).
Derwent Abstract for JP–A 11–145095 (May 28, 1999).
Derwent Abstract for JP–A 11–162907 (Jun. 18, 1999).
Derwent Abstract for JP–A7–297158 (Nov. 10, 1995).
Derwent Abstract for JP–A 8–1778 (Jan. 9, 1996).
Derwent Abstract for JP–A 11–116984 (Apr. 27, 1999).
Derwent Abstract for JP–A 6–313189 (Nov. 8, 1994).
Derwent Abstract for JP–A6–313192 (Nov. 8, 1994).

* cited by examiner

*Primary Examiner*—Gregory Webb
(74) *Attorney, Agent, or Firm*—Armstrong, Kratz, Quintos, Hanson & Brooks, LLP

(57) ABSTRACT

This invention relates to a cleaning agent for a semi-conductor substrate, particularly, one having copper wirings on its surface, comprising a nonionic surfactant and a method for cleaning the same.

The said cleaning agent and the method have made it possible to control a speed of etching on silicone oxide so as to remove impurities adsorbed on copper wirings and silicone oxide on a surface of a semi-conductor substrate having copper wirings on its surface, such as copper oxides and particles, without causing corrosion or oxidation of copper wirings nor causing roughness on the surface.

1 Claim, No Drawings

CLEANING AGENT FOR A SEMI-CONDUCTOR SUBSTRATE

This application is a divisional of prior application Ser. No. 09/712,904, filed Nov. 16, 2000 now U.S. Pat. No. 6,534,458, which is a divisional of prior application Ser. No. 09/610,657, filed Jul. 5, 2000 now U.S. Pat. No. 6,310,019, both of which are hereby incorporated by reference.

BACKGROUND OF THE INVENTION

The present invention relates to a cleaning agent for a semi-conductor substrate and a method for cleaning the same.

Structures of LSI have recently been developed into fine-processed ones in accordance with the recent trend toward high integration and thus the LSI has been molded into multi-layered structures wherein multi-level wirings are formed on a surface of a semi-conductor, and use of copper wirings having lower electric resistance has been proposed in place of so far used aluminum wirings.

In a process for preparation of a semi-conductor having a multi-layered structure wherein multi-level wirings are piled on a surface of a semi-conductor, use has been made of so-called Cu-chemical-mechanical polishing technology (Cu-CMP) wherein a semi-conductor substrate is mechanically polished during metallic Cu being oxidized so as to realize planarization on a semi-conductor substrate surface.

On the other hand, after the Cu-CMP treatment, Cu wirings and dielectric silicone oxide film which are intended to separate the Cu wirings with one another are naked on the surface of the semi-conductor substrate surface and further a surface of a wafer is contaminated with a large amount of metal impurities and particles.

Metal contamination is caused by adsorption of copper oxides on the silicone oxide which are produced from ground metallic Cu by the CMP process, and particle contamination is caused by slurry used for polishing in the CMP process.

Copper oxides existing on the silicone oxide are dispersed in the films after treatment under heating, whereby insulation is decreased to make quality of devices degraded and in the worst case the wirings previously separated are connected with one another to cause shortening, which results in breakdown of the devices. For this reason, the copper oxides have to be removed before conducting the next step of processes. Further, particle contamination has to be eliminated, because the staining gives bad influence upon the next step of processes.

Therefore, a cleaning process step in order to remove the impurities and particles is indispensable after the Cu-CMP process.

Acidic cleaning solutions such as those containing hydrochloric acid and hydrofluoric acid which have generally been used after the Cu-CMP process are accompanied with such a drawback that they dissolve not only the copper oxides deposited on the silicone oxide but also metallic Cu in wirings so as to cause corrosion and breakdown of wirings. Use of the acidic solutions has also such a problem that a surface of a semi-conductor substrate and particles are electrostatistically pull against each other, whereby particles cannot be removed and adversely they are adsorbed on the surface.

It has been said, on the other hand, that use of alkaline cleaning solutions whereupon particles and a surface of semi-conductor substrate are repelling with each other is generally advantageous in order to remove particles. However, when a cleaning agent containing a metal ion as an alkaline source such as a cleaning agent containing sodium hydroxide or potassium hydroxide is used, those metals are adsorbed on a surface of the silicone oxide, etc. so as to reduce the insulating effect. Further, among cleaning agents containing no metal ion, an agent containing inorganic alkaline substance such as an aqueous ammonium solution cannot be used because they strongly dissolve copper.

On the other hand, a cleaning agent containing a quaternary ammonium compound has such merit as not corroding copper wirings and having high effect of removing particles, while it has such a drawback that it has high etching effect to the silicone oxide so as to cause roughness on a surface, though the surface is once made into smooth by the CMP process, because a quaternary ammonium compound is strongly alkaline.

It has also been known that hydrogen peroxide is added to the agent containing a quaternary ammonium compound whereby etching speed can be reduced. However, also in this case, such a problem is found that a surface of copper wirings is oxidized by the oxidizing effect of hydrogen peroxide whereby electric conductivity is reduced.

As explained above, there has been contrived no cleaning agent which can remove impurities on a surface of semi-conductor substrate having copper wirings on its surface without causing corrosion and oxidation of copper wirings nor causing roughness on the surface.

SUMMARY OF THE INVENTION

The present invention has been accomplished taking the above situation into consideration and the object of the invention is to provide a cleaning agent and a cleaning method for a surface of a semi-conductor substrate, particularly one having copper wirings on its surface which can effectively remove impurities on a surface without causing corrosion or oxidation of copper wirings nor causing roughness on the surface.

The present invention, thus, relates to;

(1) a cleaning agent for a semi-conductor substrate having copper wirings on its surface, comprising a nonionic surfactant, (2) a method for cleaning a surface of a semi-conductor substrate having copper wiring on its surface, comprising treating a surface of a semi-conductor substrate having copper wirings on its surface with a cleaning agent containing a nonionic surfactant, and (3) a semi-conductor substrate having copper wirings on its surface, which is obtained by treating a surface of a semi-conductor substrate having copper wirings on its surface with a cleaning agent containing a nonionic surfactant.

PREFERRED EMBODIEMNTS OF THE INVENTION

The present inventors have made extensive study in order to realize the object mentioned above to arrive at the finding that treating a surface of a semi-conductor substrate having copper wirings on its surface with a cleaning agent containing a nonionic surfactant has made it possible to control a speed of etching on silicone oxide so as to remove impurities adsorbed on copper wirings and silicone oxide on a surface of a semi-conductor substrate having copper wirings on its surface, such as copper oxides and particles, without causing corrosion or oxidation of copper wirings nor causing roughness on the surface, further that this effect can more advantageously be attained when a nonionic surfactant having an acetylene group:

in its molecule is used, and still further that particularly when this cleaning agent is adjusted to alkaline by incorporating therein an N-containing alkaline substance such as ammonia, a primary to tertiary amine and a quaternary ammonium compound, among which a quaternary ammonium compound is most effective, this effect can be more remarkable, and on the basis of those findings the present invention has been accomplished.

As the nonionic surfactant, any one so far been known can be used, and among them, one having an acetylene group:

in its molecule is preferable, and one having an acetylene group:

and a polyoxyalkylene group is more preferable.

The polyoxyalkylene group includes one shown by the following general formula [1]:

[1]

(wherein X is an alkylene group and y is a positive integer).

The alkylene group shown by X in the general formula [1] preferably includes straight chained, branched and cyclic lower alkylene group having 1 to 6 carbon atoms, which is specifically exemplified by a methylene group, an ethylene group, a propylene group, a butylene group, a methylmethylene group, an ethylethylene group, a methylethylene group, a methylpropylene group, an ethylpropylene group, a pentylene group, a hexylene group, a cyclopentylene group, a cyclohexylene group, etc., among which an ethylene and a propylene group are preferable.

The symbol y is a positive integer, generally of 1 to 10, preferably 1 to 8, and among the groups, one wherein y is 2 to 8 is most preferable because it shows low foaming ability and consequently foaming can effectively be prevented even when it is co-used with a mechanical cleaning process so as to prevent troubles by foaming. The kinds of the oxyalkylene groups in a number of y may be the same with one another or the oxyalkylene groups in a number of y may be composed of two or more different kinds of the groups.

Among the oxyalkylene groups shown by —(X—O)— in the general formula [1], an oxyethylene group and an oxypropylene group are preferable, and the polyoxyalkylene group shown by —(X—O)y— includes one composed only of an oxyethylene group, one composed only of an oxypropylene group and one composed of a combination of an oxyethylene group and an oxypropylene group as preferable examples. In a case where it is composed of a combination of an oxyethylene group and an oxypropylene group, a ratio thereof is such as generally the oxyethylene group being 50% in number or more, preferably the oxyethylene group being 70% in number or more.

Examples of the nonionic surfactant having a group of:

and the polyoxyalkylene group, shown by the general formula [1] are those shown by the following general formula [2]:

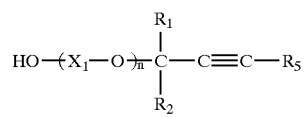

[2]

(wherein $X_1$ is a lower alkylene group, n is a positive integer, $R_1$ and $R_2$ are each independently a hydrogen atom, a hydroxy group, an alkyl group or a hydroxyalkyl group, and $R_5$ is a hydrogen atom, a hydroxy group, an alkyl group, a hydroxyalkyl group or a group shown by the general formula [3]:

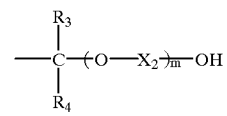

[3]

in which $R_3$ and $R_4$ are each independently a hydrogen atom, a hydroxy group, an alkyl group or a hydroxyalkyl group, $X_2$ is a lower alkylene group and m is a positive integer).

The lower alkylene group shown by $X_1$ and $X_2$ in the above general formula [2] and [3] has the same meaning as in X in the above general formula [1], and m and n have also the same meaning as in y in the above general formula [1].

When $R_5$ is a group shown by the general formula [3], the total number of m and n is generally 2 to 20, preferably 2 to 16, and one wherein the total number is 4 to 16 is most preferable because it shows low foaming ability and consequently foaming can effectively be prevented even when it is co-used with a mechanical cleaning process so as to prevent troubles by foaming from causing.

Among the nonionic surfactant of the general formula [2], one wherein $X_1$ and $X_2$ are an ethylene group and/or a propylene group is particularly preferable.

Examples of those preferable ones are those shown by the following general formula [2']:

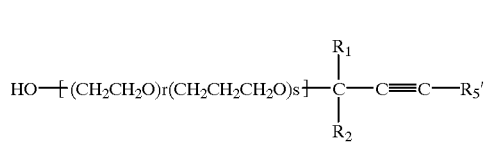

[2']

(wherein $R_1$ and $R_2$ have the same meaning as above, r and s are each independently 0 or a positive integer, $R_{5'}$ is a hydrogen atom, a hydroxy group, an alkyl group, a hydroxyalkyl group or a group shown by the general formula [3']:

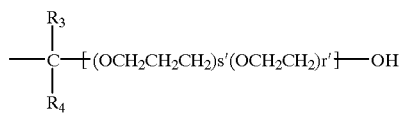

in which $R_3$ and $R_4$ have the same meaning as above, r' and s' are each independently 0 or a positive integer, excepting a case where all of r, s, r' and s' are 0 at the same time).

Among the above, one wherein $R_{5'}$ is a group of [3'] in the general formula [2'], namely one shown by the following general formula [2''] is particularly preferable:

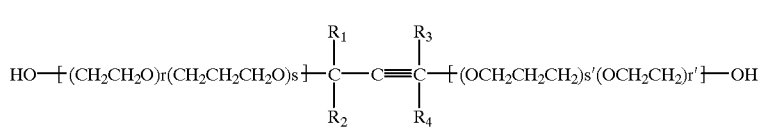

(wherein the symbols have the same meaning as above).

In the above general formula [2'] and [2''], a group shown by the following formula:

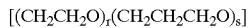

means one composed of a block of oxyethylene groups in r number and a block of oxypropylene groups in s number (so-called blocked copolymer) and one composed of oxyethylene groups and oxypropylene groups which are bound with each other randomly, the total number of the former being r and that of the latter being s (so-called random copolymer).

In the above general formula [3'] and [2''], a group shown by the following formula:

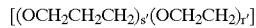

has the same meaning as just above.

The compound of the general formula [2] wherein $R_5$ is a group shown by the general formula [3] is prepared, for example, by reacting a glycol compound of the following general formula [2-1]:

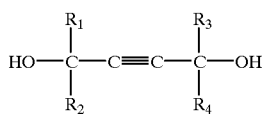

(wherein the symbols have the same measning as above) with an alkylene oxide corresponding to the formula:

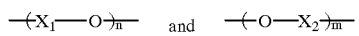

(wherein the symbols have the same meaning as above) according to a known method as described in U.S. Pat. No. 3,291,607.

The alkyl group shown by $R_1$ to $R_5$ and $R_{5'}$ in the above general formula [2], [3], [2'], [3'] and [2''] may be saturated or unsaturated or may be straight chained, branched or cyclic and includes one having 1 to 10 carbon atoms, preferably 1 to 6 carbon atoms, more preferably 1 to 3 carbon atoms, which is specifically exemplified by a saturated straight chained one such as a methyl group, an ethyl group, an n-propyl group, an n-butyl group, an n-pentyl group, an n-hexyl group, an n-heptyl group, an n-octyl group, an n-nonyl group and an n-decanyl group, a saturated branched one such as an iso-propyl group, an iso-butyl group, a sec-butyl group, a tert-butyl group, an iso-pentyl group, a sec-pentyl group, a tert-pentyl group, a neopentyl group, an iso-hexyl group, a sec-hexyl group, a tert-hexyl group, an iso-heptyl group, a sec-heptyl group and a tert-heptyl group, a cyclic one such as a cyclopentyl group and a cyclohexyl group, an unsaturated straight chained one such as a vinyl group, an n-propenyl group and an n-butenyl group, an unsaturated branched one such as an iso-propenyl group, an iso-butenyl group, a sec-butenyl group and a tert-butenyl group, etc.

The hydroxyalkyl group includes one wherein 1 or more, preferably 1 to 3 hydrogen atoms, preferably only terminal hydrogen atoms, in the above mentioned alkyl group are substituted by a hydroxy group.

The total number of r, s, r' and s' is generally 1 to 20, preferably 1 to 16, and groups wherein the total number is 4 to 16 is most preferable because the surfactants having such total number show low foaming ability and consequently foaming can effectively be prevented even when they are co-used with a mechanical cleaning process so as to prevent troubles by foaming.

Among the above, particularly preferable cases are where s and s' are each independently 0 to 2 and at the same time r and r' are each independently 4 to 6.

Typical examples of the nonionic surfactant are 1,4-diisobutyl-1,4-dimethylbut-2-yn diol polyoxyethylene glycol ether of the formula [6]:

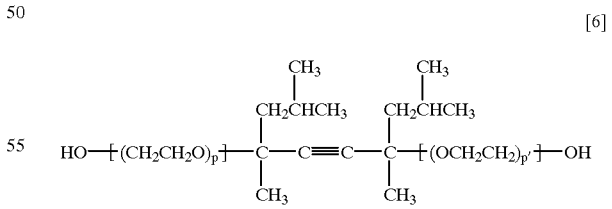

(in which the total number of (p+p') is, generally 1 to 20, preferably 1 to 16, more preferably 4 to 16), 1,4-diisobutyl-1,4-dimethylbut-2-yn diol polyoxyethylene-polyoxypropylene glycol ether of the formula [7]:

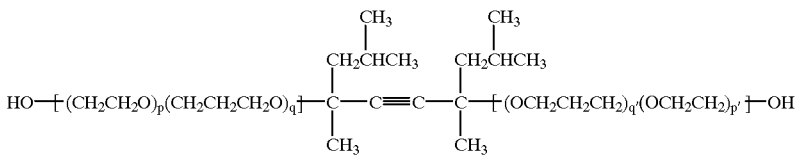

[7]

(in which (p+q+p'+q') is, generally 1 to 20, preferably 1 to 16, more preferably 4 to 16). 1,4-diisobutyl-1,4-dimethylbut-2-yn diol polyoxypropylene glycol ether of the formula [8]:

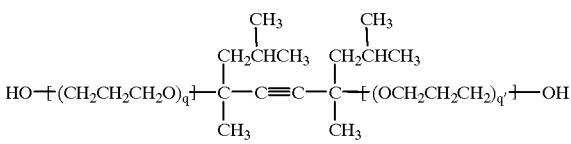

[8]

(in which (q+q') is, generally 1 to 20, preferably 1 to 16, more preferably 4 to 16).

Those compounds may be prepared by the method mentioned above, or commercially available ones may be used in the present invention.

The nonionic surfactant may be used alone or in a suitable combination of two or more thereof.

An amount of the nonionic surfactant to be used may be any one so far as it is not less than a critical micelle concentration, and when it is less than the critical micelle concentration, a speed of etching becomes higher and thus the effect is reduced. Specific amount of the surfactant to be used depends upon the kind of the surfactant and generally 1 ppm or more in the cleaning composition without no specific upper limitation, and from an economical point of view the amount is 1 to 10000 ppm, preferably 10 to 1000 ppm in the cleaning agent.

The ammonia or the primary to tertiary amine of the present invention includes one shown by the following general formula [4]:

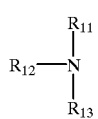

[4]

(wherein $R_{11}$, $R_{12}$ and $R_{13}$ are each independently a hydrogen atom, a lower alkyl group or a hydroxy lower alkyl group).

The lower alkyl group shown by $R_{11}$, $R_{12}$ and $R_{13}$ in the general formula [4] may be straight chained, branched or cyclic and includes one having 1 to 6 carbon atom, which is specifically exemplified by a methyl group, an ethyl group, an n-propyl group, an iso-propyl group, an n-butyl group, a sec-butyl group, an iso-butyl group, a tert-butyl group, an n-pentyl group, an iso-pentyl group, a sec-pentyl group, a tert-pentyl group, a neopentyl group, an n-hexyl group, an iso-hexyl group, a sec-hexyl group, a tert-hexyl group, a cyclopentyl group, a cyclohexyl group, etc.

The hydroxy lower alkyl group shown by $R_{11}$, $R_{12}$ and $R_{13}$ includes one wherein a hydrogen atom, preferably a terminal hydrogen atom of the lower alkyl group mentioned above is substituted by a hydroxy group, which is specifically exemplified by a hydroxymethyl group, a hydrdoxyethyl group, a 3-hydroxy-n-propyl group, 4-hydroxy-n-butyl group, an 1-methyl-2-hydroxyethyl group, a 2-methyl-3-hydroxypropyl group, an 1,1-dimethyl-2-hydroxyethyl group, etc.

Typical examples of the compound shown by the general formula [4] are ammonia, a primary amine such as methylamine, ethylamine, n-propylamine and n-butylamine, a secondary amine such as dimethylamine, diethylamine, methylethylamine, di-n-propylamine and di-n-butylamine, a tertiary amine such as trimethylamine, triethylamine, methyldiethylamine, tri-n-propylamine and tri-n-butylamine, a priamary hydroxyamine such as monoethanolamine, a secondary hydroxyamine such as diethanolamine, a tertiary hydroxyamine such as triethanolamine, etc.

The quaternary ammonium compound of the present invention includes one shown by the following general formula [5]:

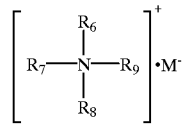

[5]

(wherein $R_6$ to $R_9$ are each independently a hydrocarbon residue which may have a hydroxy group and $M^-$ is an anion).

The hydrocarbon residue which may have a hydroxy group shown by $R_6$ to $R_9$ in the general formula [5] includes aliphatic, aromatic, aromatoaliphatic and alicyclic, and the aliphatic and the aliphatic in the aromatoaliphatic may be saturated or unsaturated and may be straight chained or branched.

Among them, straight chained, branched or cyclic saturated or unsaturated alkyl groups and aralkyl groups and aryl groups are exemplified as typical examples.

The alkyl group includes generally a lower alkyl one having 1 to 6 carbon atoms, preferably 1 to 4 carbon atoms, which is specifically exemplified by a methyl group, an ethyl group, an n-propyl group, an iso-propyl group, an n-butyl group, a sec-butyl group, an iso-butyl group, a tert-butyl group, an n-pentyl group, an iso-pentyl group, a sec-pentyl group, a tert-pentyl group, a neopentyl group, an n-hexyl group, an iso-hexyl group, a sec-hexyl group, a tert-hexyl group, a cyclopentyl group, a cyclohexyl group, a vinyl group, an n-propenyl group, an iso-propenyl group, an n-butenyl group, an iso-butenyl group, a sec-butenyl group, a tert-butenyl group, etc.

The aralkyl group includes one having generally 7 to 12 carbon atoms, which is specifically exemplified by a benzyl group, a phenethyl group, a phenylpropyl group, a phenylbutyl group, a phenylhexyl group, a methylbenzyl group, a methylphenethyl group, an ethylbenzyl group, etc.

The aryl group includes one having generally 6 to 14 carbon atoms, which is specifically exemplified by a phenyl group, an o-tolyl group, a m-tolyl group, a p-tolyl group, a 2,3-xylyl group, a 2,4-xylyl group, a 2,5-xylyl group, a 2,6-xylyl group, a 3,5-xylyl group, a naphthyl group, an anthryl group, etc.

The aromatic ring in the above aryl group and the aralkyl group may contain a substituent including a lower alkyl group such as a methyl and an ethyl group, a halogen atom, a nitro group, an amino group, etc. The hydrocarbon residue having a hydroxy group includes one wherein a hydrogen atom in the above mentioned hydrocarbon residue are substituted by a hydroxy group.

The anion shown by $M^-$ in the general formula [5] includes $OH^-$.

Specific examples of the quaternary ammonium compound mentioned above are tetramethylammonium hydroxide (TMAH), trimethyl-2-hydroxyethylammonium hydroxide (choline), tetraethylammonium hydroxide, tetrapropylammonium hydroxide, tetrabutylammonium hydroxide, monomethyltriethylammonium hydroxide, dimethyldiethylammonium hydroxide, trimethylmonoethylammonium hydroxide, monomethyltripropylammonium hydroxide, dimethyldipropylammonium hydroxide, timethylmonopropylammonium hydroxide, monomethyltributylammonium hydroxide, dimethyldibutylammonium hydroxide, trimethylmonobutylammonium hydroxide, monoethyltripropylammonium hydroxide, diethyldipropylammonium hydroxide, triethylmonopropylammonium hydroxide, monoethyltributylammonium hydroxide, diethyldibutylammonium hydroxide, tritehylmonobutylammonium hydroxide, monoproptyltributylammonium hydroxide, dipropyldibutylammonium hydroxide, tripropylmonobutylammonium hydroxide, triethyl-2-hydroxyethylammonium hydroxide, tripropyl-2-hydroxyethylammonium hydroxide, tributyl-2-hydroxyethylammonium hydroxide, trimethyl-3-hydroxypropylammonium hydroxide, triethyl-3-hydroxypropylammonium hydroxide, tripropyl-3-hydroxypropylammonium hydroxide, tributyl-3-hydroxypropylammonium hydroxide, trimethyl-4-hydroxybutylammonium hydroxide, triethyl-4-hydroxybutylammonium hydroxide, tripropyl-4-hydroxybutylammonium hydroxide, tributyl-4-hydroxybutylammonium hydroxide, trimethyl-3-hydroxybutylammonium hydroxide, triethyl-3-hydroxybutylammonium hydroxide, tripropyl-3-hydroxybutylammonium hydroxide, tributyl-3-hydroxybutylammonium hydroxide, dimethylethyl-2-hydroxyethylammonium hydroxide, methyldiethyl-2-hydroxyethylammonium hydroxide, dimethylethyl-3-hydroxypropylammonium hydroxide, methyldiethyl-3-hydroxypropylammonium hydroxide, dimethylethyl-4-hydroxybutylammonium hydroxide, methyldiethyl-4-hydroxybutylammonium hydroxide, dimethylethyl-3-hydroxybutylammonium hydroxide, methyldiethyl-3-hydroxybutylammonium hydroxide, dimethyldi(2-hydroxyethyl)ammonium hydroxide, dimethyldi(3-hydroxypropyl)ammonium hydroxide, dimethyldi(3-hydroxybutyl)ammonium hydroxide, dimethyldi(4-hydroxybutyl)ammonium hydroxide, diethyldi(2-hydroxyethyl)ammonium hydroxide, diethyldi(3-hydroxypropyl)ammonium hydroxide, diethyldi(3-hydroxybutyl)ammonium hydroxide, diethyldi(4-hydroxybutyl)ammonium hydroxide, methylethyldi(2-hydroxyethyl)ammonium hydroxide, diethyldi(3-hydroxybutyl)ammonium hydroxide, methylethyldi(4-hydroxybutyl)ammonium hydroxide, methylethyldi(4-hydroxybutyl)ammonium hydroxide, methyltri(2-hydroxyethyl)ammonium hydroxide, ethyltri(2-hydroxyethyl)ammonium hydroxide, propyltri(2-hydroxyethyl)ammonium hydroxide, butyltri(2 - hydroxyethyl)ammonium hydroxide, methyltri(3-hydroxypropyl)ammonium hydroxide, ethyltri(3-hydroxybutyl)ammonium hydroxide, methyltri(4-hydroxybutyl)ammonium hydroxide, ethyltri(4-hydroxybutyl)ammonium hydroxide, methyltri(3-hydroxybutyl)ammonium hydroxide, ethyltri(3-hydroxybutyl)ammonium hydroxide, etc.

Among the compound shown by the general formula [4] and the general formula [5], the quaternary ammonium compound shown by the general formula [5] is preferable, and among the quaternary ammonium compound, tetramethylammonium hydroxide (TMAH), trimethyl-2-hydroxyethylammonium hydroxide (choline), etc. are particularly preferable.

The compound of the general formula [4] or the quaternary ammonium compound of the general formula [5] may be used alone or in a suitable combination of two or more thereof.

An amount of compound of the general formula [4] or the quaternary ammonium compound of the general formula [5] to be used in the present cleaning agent depends upon its kind and when the amount is too low, a speed of etching is lowered and the effect is reduced, and the amount is generally 0.003% (w/v) or more without specific upper limitation. From an economical point of view, the amount is generally 0.003 to 10% (w/v), preferably 0.01 to 6% (w/v), more preferably 0.05 to 1% (w/v).

(1) Preferable specific embodiments of the cleaning agent of the present invention are;

a cleaning agent for a semi-conductor substrate, comprising as the essential ingredients
(a) ammonia or a primary to tertiary amine which is shown by the general formula [4] or a quaternary ammonium compound shown by the general formula [5]:

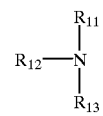

[4]

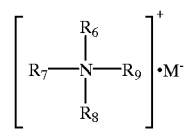

[5]

(the symbols have the same meaning as above), as an N-containing alkaline substance and
(b) a nonionic surfactant shown by the general formula [2]:

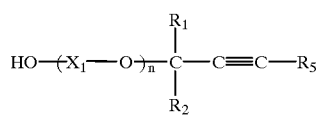

[2]

(symbols have the same meaning as above).

(2) More preferable specific embodiments of the cleaning agent of the present invention are;

a cleaning agent for a semi-conductor substrate, comprising as the essential ingredients
(a') a quaternary ammonium compound shown by the general formula [5]:

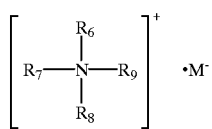

(symbols have the same meaning as above) and
(b') a nonionic surfactant shown by the general formula [2']:

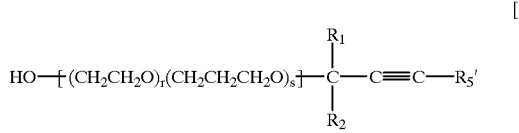

(wherein the symbols have the same meaning as above), (3) The most preferable specific embodiments of the cleaning agent of the present invention are;

a cleaning agent for a semi-conductor substrate, comprising as the essential ingredients (a") a quaternary ammonium compound shown by the general formula [5']:

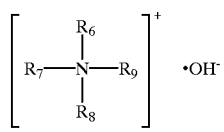

(wherein the symbols have the same meaning as above) and (b") a nonionic surfactant shown by the general formula [2"]:

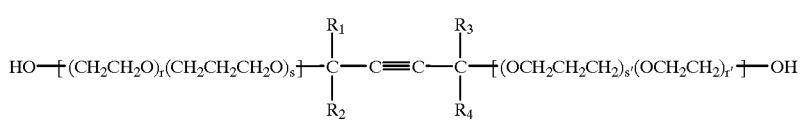

(wherein the symbols have the same meaning as above).

In the above specific embodiments, those wherein $R_1$ and $R_3$ are a methyl group and $R_2$ and $R_4$ are an isobutyl group in the general formula [2"] and $R_6$ to $R_9$ are a methyl group or three of $R_6$ to $R_9$ are a methyl group and the rest is a 2-hydroxyethyl group in the general formula [5'] are particularly preferable.

The above specific embodiments are particularly useful for cleaning a surface of a semi-conductor substrate having copper wirings on its surface, though they can be used as a cleaning agent for a print circuit substrate, LCD circuit, etc.

The cleaning agent of the present invention is generally formulated into an aqueous solution, and it is prepared generally by dissolving the nonionic surfactant or both of the nonionic surfactant and the N-containing alkaline substance in water.

Thus prepared cleaning agent is desirably subjected to filtration, etc. before actual use.

Water to be used for the preparation of the cleaning agent is preferably one purified by distillation, ion exchange resin treatment, etc. and so-called ultra-pure water is most desirable.

The cleaning agent of the present invention is preferably in alkaline condition, generally adjusted to pH 9 or more, preferably pH 9 to 12, more preferably pH 9.5 to 10.5. This pH adjustment can reduce risk of etching the dielectric $SiO_2$ films and can increase the effect of removing particles and copper oxides because electric repelling effect between a surface of a semi-conductor substrate and particles is increased.

In order to adjust the pH of the cleaning agent of the present invention, use may still be made of a pH regulating agent so far conventionally used in this kind of technical field, including a carboxylic acid such as citric acid, oxalic acid, phthalic acid and tartaric acid and their derivatives and salts, phosphoric acid, phosphoric acid derivatives or salts, etc.

Among the cleaning agent of the present invention, those showing a buffering effect in the above mentioned pH range are preferable. In order to give the buffering effect to the cleaning agent, use is made of any one or suitable combinations of two or more of the above pH regulating agents which can afford the buffering effect to the cleaning agent or of one or suitable combinations of two or more of the pH regulating agent together with any other kind of a pH regulating agent. For this purpose, use may be made also of combinations of two or more kinds of substances which can afford the buffering effect, though each substance alone cannot afford the buffering effect and of a substance which can afford the buffering effect when used with the N-containing alkaline substance of the present invention, though the substance alone cannot afford the effect. When the buffering effect can be attained only by the use of the N-containing alkaline substance of the present invention, no additional use of a substance for affording the buffering effect is necessary.

An amount of the pH regulating agent to be used depends upon the kind of the agent and is selected from such a range as regulating pH within the above range upon addition to the cleaning agent, and generally it is 0.0001 to 10% (w/v), preferably 0.001 to 1% (w/v), relative to the total amount of the cleaning agent.

In the cleaning agent of the present invention, there may be incorporated a chelating agent which has no ability of dissolving copper wirings, and use of the chelating agent can dissolve again copper oxides dispersed in the solution so as to prevent re-adsorption thereof and can remove metallic impurities such as Fe and Al originated from the slurry in the CMP process from the surface.

The chelating agent which has no ability of dissolving copper wirings includes a carboxylic acid compound such as ethylenediamine tetraacetate (EDTA), trans-1,2-diaminocyclohexane-N,N,N',N'-tetraacetate (CyDTA) and nitiro triacetate (NTA), phosphonic acid compound such as ethylenedaimine tetrakis(methylenephosphonic acid) (EDTPO), etc.

An amount of the chelating agent to be used depends upon the kind of the chelating agent and is selected from such a range as giving the above effect upon using and generally 0.0001 to 1% (w/v), preferably 0.001 to 0.1% (w/v), relative to the total amount of the cleaning agent.

The cleaning agent of the present invention may further be incorporated with an organic solvent in order to prevent separation of the nonionic surfactant and the N-containing alkaline substance from each other in an amount of generally 0.01 to 5% (w/v), preferably 0.1 to 1% (w/v), relative to the total amount of the cleaning agent. The organic solvent includes methanol, ethanol, isopropyl alcohol, acetone, etc.

In addition to the above nonionic surfactant, the N-containing alkaline substance, the pH regulating agent, the chelating agent and the organic solvent, other reagents so far generally been used in this kind of technical field may also be incorporated into the cleaning agent of the present invention.

The agent includes a reducing agent for the purpose of protection of copper wirings and of prevention of copper corrosion such as hydrazine or its derivatives, ascorbic acid, formic acid and formaldehyde, a corrosion inhibitor such as benzotriazole or its derivatives and thiourea compounds, an agent for improving wettability of the semi-conductor substrate surface to the cleaning agent so as to increase the cleaning effect such as a surfactant other than the nonionic surfactant such as an anion surfactant including dodecylbenzene sulfonate, a cationic surfactant including alkyltrimethylammonium and an amphoteric surfactant including carboxybetaines.

Those agents may be used in such an amount as being used generally in this kind of technical field.

For instance, an amount of the reducing agent may be selected from such a range as capable of preventing oxidization of metallic copper, and is generally 0.01 to 5 wt %, preferably 0.05 to 1 wt %. An amount of the corrosion inhibitor is selected from such a range as forming weak bonding to metallic copper so as to reduce dissolving ability of the cleaning agent against metallic copper and is generally 0.01 to 5 wt %, preferably 0.05 to 1 wt %. An amount of the surfactant other than the nonionic surfactant is selected from such a range as lowering surface tension of the cleaning agent and is generally 0.0001 to 1 wt %, preferably 0.001 to 0.1 wt %.

The method for cleaning of the present invention is conducted by treating a surface of a semi-conductor substrate having copper wirings on its surface with the above mentioned cleaning agent of the present invention.

The method for treating a surface of a semi-conductor substrate having copper wirings on its surface may be any of known ones so far been generally used in this kind of technical field, such as dipping treatment wherein a semi-conductor substrate is dipped in a cleaning agent and batch type treatment wherein a cleaning agent is showered on a surface of a semi-conductor substrate.

Further, in the present invention, co-use of a mechanical cleaning process upon cleaning can remove more effectively copper oxides. Embodiment of the co-use is exemplified by a process wherein a semi-conductor substrate surface is subjected to a mechanical cleaning process in the presence of the cleaning agent of the present invention.

In the above method, a process for allowing the cleaning agent of the present invention to exist includes one wherein a mechanical cleaning process is conducted during the dipping treatment or the batch type treatment under the presence of the cleaning agent of the present invention.

The mechanical cleaning process includes brush-scrubbing cleaning wherein a surface of a semi-conductor substrate is cleaned with the use of highly rotating brush made of polyvinyl alcohol, etc. and megasonic cleaning with the use of high frequency wave, etc.

More specific embodiment of the cleaning method together with a mechanical cleaning process includes a process wherein a semi-conductor is dipped in the cleaning agent of the present invention and then the semi-conductor is taken out of the cleaning agent, followed by conducting a mechanical cleaning process under the presence of the cleaning agent, a process wherein a semi-conductor dipped in the cleaning agent of the present invention is, as it is, subjected to a mechanical cleaning process, a process wherein the cleaning agent of the present invention is showered on a semi-conductor surface and then a mechanical cleaning process is conducted on thus treated semi-conductor under the presence of the cleaning agent, a process wherein a mechanical cleaning process is conducted during the cleaning agent of the present invention is showered on a semi-conductor surface, etc.

In using the cleaning agent of the present invention containing the nonionic surfactant, there can be attained such an effect as protecting copper wirings so as to prevent particles originated from slurry and wasted materials produced from silicone oxide by slight etching, which are dispersed in the cleaning agent, from adsorbing to the copper wirings.

Particularly in using the cleaning agent containing not only the nonionic surfactant but also the quaternary ammonium compound, etching of insulating membranes by the quaternary ammonium compound can be reduced and thus the excellent effect of removing particles attained by the quaternary ammonium compound can advantageously be utilized without corrosion of copper wirings and consequently etching of dielectric silicone oxide films can be reduced to the minimum so as to cause no roughness of a surface.

Further re-adsorption of peeled-off copper oxides can be prevented effectively.

Use of a cationic, anionic or amphoteric surfactant causes electric binding to a surface of a semi-conductor so as to retard cleaning effect and further causes sometimes change of electric charges on a surface of particles originated from slurry, which are originally alkaline and electrically repellent against a surface of a semi-conductor, so as to cause re-adsorption of the particles.

As mentioned above, use of a cleaning agent containing a nonionic surfactant, particularly one having an acetylene group in its molecule, desirably together with an N-containing alkaline substance such as ammonia, a primary to tertiary amine and a quaternary ammonium compound, among which a quaternary ammonium compound is most preferable, for cleaning a surface of a semi-conductor substrate having copper wirings on its surface, shows such an excellent effect as capable of removing impurities adsorbed on the surface without causing corrosion or oxidation of copper wirings nor causing roughness of the surface whereby increased clean state of the surface can be realized.

The cleaning agent of the present invention is, as mentioned above, extremely useful for cleaning a surface of semi-conductor substrate having copper wirings on its surface, and additionally the agent can also be used for cleaning a surface of semi-conductor substrate having wirings of other than copper, such as aluminum wirings and tungsten plugs on its surface.

Still further, the cleaning agent of the present invention can be used for cleaning not only a surface of a semi-conductor substrate but also a surface of a print circuit, LCD substrate, etc.

In the following, the present invention is further explained referring to Examples and Control examples, but it is not limited thereto by any means.

The nonionic surfactants used in the following Examples are synthesized by reacting the corresponding glycol compound with an alkylene oxide after a method described in U.S. Pat. No. 3,291,607.

The thermal oxidized wafer, Cu-contaminated wafer, Cu-deposited wafer, particle-contaminated wafer, which were used in the following Examples and Control examples were prepared as below, and measurements of the thickness of thermal oxidized film and the thickness of copper film on a surface of Cu-deposited wafer and of the amount of adsorbed copper atom (residual copper concentration) on a surface of Cu-contaminated wafer and particles were conducted as below.

[thermal oxidized wafer]

Silicone wafer of 4 inches was treated with 1% aqueous hydrofluoric acid solution to remove natural oxide and subjected to heat treatment at 800° C. to form thermal oxidized film (silicone oxide film, dielectric film). The resultant was used as the thermal oxidized film. The thickness of the thermal oxidized film was confirmed as 500 Å by the following method.

[Cu-contaminated wafer]

Thermal oxidized wafer was dipped in an aqueous nitric acid solution containing 1 ppm copper ion for 1 minute, washed with stream of ultra-pure water for 10 minutes and spin-dried. The resultant was used as the Cu-contaminated wafer.

It was confirmed by the following method that the wafers contained $3 \times 10^{14}$ copper atoms/cm$^2$ as adsorbed residue.

[copper-deposited wafer]

Metallic copper was deposited by spattering on a surface of thermal-oxidized wafer.

The resultant was used as the copper-deposited wafers.

The thickness of the coppers deposited on a surface of the wafers was confirmed as 1000 Å by the following method.

[particle-contaminated wafer]

Thermal oxidized wafers or copper-deposited wafers were respectively dipped in 3% aqueous slurry containing alumina having an average particle size of 0.2 μm for 1 minute, washed with streams of ultra-pure water for 10 minutes and spin dried. The resultants were used as the thermal-oxidized wafers and the copper-deposited wafers.

It was confirmed by the following method that about 850 particles/4 inch wafer were adsorbed on the thermal oxidized waters contaminated with particles and that about 90 particles/4 inch wafer were adsorbed on the copper-deposited wafer contaminated with particles.

[Method for measurement of thickness of oxidized film]

Measurement was conducted by using Ellipso meter.

[Method for measurement of thickness of copper film]

Wafer was cut into two pieces and the cross section was observed by a scanning electron microscope to measure the thickness.

[Method for measurement of adsorbed amount of Cu atoms (residual copper concentration)]

The copper adsorbed on a surface of a wafer was recovered by dissolving by aqueous hydrofluoric acid-nitric acid, and a concentration of copper in the recovered solution was measured by an atomic adsorption spectrometry (a graphite furnace atomic adsorption spectro photometer), and on the basis of the result, the adsorbed amount of Cu atoms (residual copper concentration) was obtained.

[Method for measurement of number of particles]

The particles adsorbed on a surface of wafer were measured by a particle counter.

In the following Examples and Control examples, ppm and ppb for giving concentration are "by weight basis", unless otherwise defined, and water used is ultra-pure water which is used after confirming its copper content as lower than 0.01 ppb.

EXAMPLES

Example 1

In ultra-pure water were dissolved 1% of tetramethylammonium hydroxide (TMAH) and 0.03% of a nonionic surfactant, 1,4-diisobutyl-1,4-dimethylbut-2-yn diol polyoxyethylene glycol ether of the formula [6]:

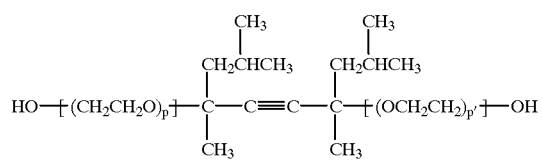

(the average mole number of oxyethylene group, [p+p']: 10) (abbreviated as Surfactant 10) to give a cleaning agent of not lower than pH 12. The thermal-oxidized wafer prepared above was dipped in the cleaning agent at 60° C. for 10 minutes, and then the wafer membranes were taken out, rinsed with ultra-pure water for 10 minutes and spin-dried. In order to investigate corrosion of the oxidized film, a thickness of the thermal-oxidized film was measured. The result was shown in Table 1.

Control Example 1

The thermal-oxidized film was treated by the same way as in Example 1 except for using a cleaning agent (pH of not less than 12) wherein only 1% of TMAH was dissolved in ultra-pure water, and a thickness of the thermal-oxidized film was measured. The result was shown in Table 1.

TABLE 1

| | Additive (amount %) | PH | Thickness of silicone oxide film (Å) |
|---|---|---|---|
| Example 1 | TMAH (1%) Surfactant 10 (0.03%) | >12 | 480 |
| Control example 1 | TMAH (1%) | >12 | 220 |

As is clear from Table 1, the cleaning agent of the present invention (Example 1) gives substantially no change to the thickness of silicone oxide film, namely it gives almost no bad influence upon the dielectric film on a surface of a semi-conductor. On the contrary, the known cleaning agent containing only the quaternary ammonium compound (Control example 1) remarkably dissolves or etches the silicone oxide film.

Example 2

In ultra-pure water were dissolved 0.001% of a nonionic surfactant, 1,4-diisobutyl-1,4-dimethylbut-2-yn diol polyoxyethylene glycol ether of the above formula [6] (the average mole number of oxyethylene group, [p+p']: 12) (abbreviated as Surfactant 12) to give a cleaning agent of pH 7. The Cu-contaminated film prepared above was dipped in the cleaning agent at 60° C. for 10 minutes, and then the film was taken out, rinsed with ultra-pure water for 10 minutes and spin-dried. In order to evaluate ability of removing impurities (copper), an amount of copper atoms adsorbed on a film surface (residual copper concentration) was measured. The result was shown in Table 2.

Control Example 2

The Cu-contaminated wafer was treated by the same way as in Example 2 except for using a cleaning agent (pH of 7) wherein 0.001% of an anion surfactant, sodium dodecylbenene sulfonate were dissolved in ultra-pure water, and in order to evaluate ability of removing impurities (copper), an amount of copper atoms adsorbed on a wafer surface (residual copper concentration) was measured. The result was shown in Table 2.

Example 3

The Cu-contaminated wafer was treated by the same way as Example 2 except for using a cleaning agent of pH 12 or more wherein 0.4% of choline and 0.001% of a nonionic surfactant, 1,4-diisobutyl-1,4-dimethylbut-2-yn diol polyoxyethylene glycol ether of the above formula [6] (the average mole number of oxyethylene group, [p+p']: 6) (abbreviated as Surfactant 6) were dissolved in ultra-pure water, and in order to evaluate ability of removing impurities (copper), an amount of copper atoms adsorbed on a wafer surface (residual copper concentration) was measured. The result was shown in Table 2.

Control Example 3

The Cu-contaminated wafer was treated by the same way as Example 2 except for using a cleaning agent of pH 12 or more wherein 0.4% of choline and 0.001% of an anion surfactant, dodecylbenzene sulfonic acid (Manufactured and sold by Lion Corp.) were dissolved in ultra-pure water, and an amount of copper atoms adsorbed on a wafer surface (residual copper concentration) was measured. The result was shown in Table 2.

Example 4

In ultra-pure water were dissolved 0.03% of tetramethylammonium hydroxide (TMAH) and 0.001% of a nonionic surfactant, 1,4-diisobutyl-1,4-dimethylbut-2-yn diol polyoxyethylene glycol ether of the formula [6] (the average mole number of oxyethylene group, [p+p']: 8) (abbreviated as Surfactant 8) to give a cleaning agent of pH 10.5.

The Cu-contaminated wafer obtained by the above process was washed by scrubbing with a highly rotating brush made of polyvinyl alcohol for 1 minute during which time the cleaning agent was showered on the wafer, and the resultant was rinsed with ultra-pure water for 10 minutes and spin-dried. In order to evaluate ability of removing impurities (copper), an amount of copper atoms adsorbed on a surface of the wafer (residual copper concentration) was measured. The result was shown in Table 2.

Control Example 4

The wafer membranes stained with metals were treated by the same way excepting for using ultra-pure water in place of the cleaning agent, and an amount of copper atoms on a surface of the wafer membranes stained with metals (residual copper concentration) was measured. The result was shown in Table 2.

TABLE 2

| | Additive (%) | pH | adsorbed amount of Cu (atoms/cm$^2$) |
|---|---|---|---|
| Example 2 | Surfactant 12 (0.001%) | 7 | $1 \times 10^{12}$ |
| Example 3 | Choline (0.4%) Surfactant 6 (0.001%) | >12 | $1 \times 10^{10}$ |
| Example 4 | TMAH (0.03%) Surfactant 8 (0.001%) | 10.5 | $5 \times 10^{9}$ |
| Control example 2 | sodium dodecyl sulfonate (0.001%) | 7 | $9 \times 10^{13}$ |
| Control example 3 | Choline (0.4%) Dodecylbenzene sulfonic acid (0.001%) | >12 | $8 \times 10^{12}$ |
| Control example 4 | None | 7 | $2 \times 10^{13}$ |

As is clear from Table 2, the cleaning agent of the present invention (Example 2) containing a nonionic surfactant remarkably reduces the residual copper concentration on a surface of wafer, and its effect of reducing the residual copper concentration is higher even compared with a cleaning agent containing a quaternary ammonium compound and an anion surfactant (Control example 3). Further, the cleaning agent of the present invention (Example 3) containing the nonionic surfactant and the quaternary ammonium compound remarkably reduces the residual copper concentration as compared with the cleaning agent (Control example 2) containing only the anionic surfactant and the cleaning agent (Control example 3) containing the quaternary ammonium compound and the anionic surfactant.

Additionally, the residual copper can be removed more effectively in a case where the chemical cleaning process and the mechanical cleaning process are used (Example 4), as compared with a case where only the chemical cleaning process is used (Example 3).

Example 5

In ultra-pure water were dissolved 3% of TMAH and 0.05% of a nonionic surfactant, 1,4-diisobutyl-1,4-dimethylbut-2-yn diol polyoxyethylene glycol ether of the formula [6] (the average mole number of oxyethylene group, [p+p']: 5) (abbreviated as Surfactant 5) to give a cleaning agent (pH 12 or more). In the obtained cleaning agent was dipped the copper-deposited wafer obtained above at room temperature (25° C.) for 30 minutes. The wafer was taken out, rinsed with ultra-pure water for 10 minutes and spin-dried. In order to investigate corrosion of copper, a thickness of the copper film was measured.

The result was shown in Table 3.

Control Example 5

The copper-deposited wafer was treated with the same way as in Example 5 except for using a cleaning agent (pH 10) wherein 3% of diethanolamine was dissolved in ultra-pure water, and a thickness of the copper film was measured.

The result was shown in Table 3.

TABLE 3

| | Additive (%) | pH | Thickness of copper film (Å) |
|---|---|---|---|
| Example 5 | TMAH (3%) Surfactant 5 (0.05%) | >12 | 1000 |
| Control example 5 | diethanolamine (3%) | 10 | 150 |

As is clear from Table 3, the cleaning agent of the present invention, namely one containing the nonionic surfactant and the quaternary ammonium compounds (Example 5) give substantially no influence upon the thickness of copper film on a surface of the copper-deposited wafer, by which none of the cleaning agents is found to etch or dissolve copper.

On the contrary, the cleaning agent containing no nonionic surfactant even containing the secondary amine (Control example 5) remarkably etches and dissolves copper.

Example 6

In ultra-pure water were dissolved 0.003% of TMAH and 0.03% of a nonionic surfactant, 1,4-diisobutyl-1,4-dimethylbut-2-yn diol polyoxypropylene-polyoxyethylene glycol ether of the formula [7]:

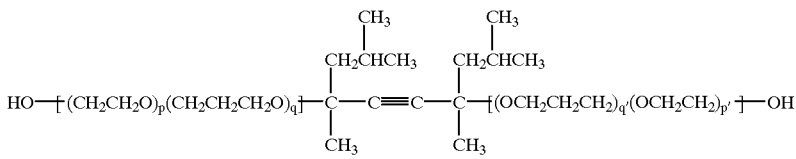

[7]

(the average mole number of oxyethylene group, [p+p']: 6, that of oxypropylene group, [q+q']: 2) (abbreviated as Surfactant 6-2) to give a cleaning agent of pH 9. The thermal-oxidized wafer contaminated with particles and the copper-deposited wafer stained with particles, which were prepared as above, were dipped in the cleaning agent at 60° C. for 10 minutes during which time 1 MHz high frequency wave was charged on the cleaning agent, followed by taking out of the cleaning agent, rinsing with ultra-pure water for 10 minutes and spin-drying. In order to evaluate ability of removing impurities (particles), numbers of particles on the wafer surface were measured.

The result was shown in Table 4.

Control Example 6

The thermal oxidized wafer membranes contaminated with particles and the copper-deposited wafers contaminated with particles were treated by the same way as Example 8 except for using a cleaning agent (pH 9) wherein 0.0003% of TMAH and 0.03% of a cationic surfactant, stearyl dimethylammonium chloride were dissolved in ultra-pure water, and numbers of particles on the wafer surface were measured.

The result was shown in Table 4.

TABLE 4

| | | | Number of particles | |
| --- | --- | --- | --- | --- |
| | Additive (%) | pH | Thermal oxidized wafer | Copper-deposited wafer |
| Example 6 | TMAH (0.003%) Surfactant 6-2 (0.03%) | 9 | 30 | 5 |
| Control example 6 | TMAH (0.003%) stearyl dimethylammonium chloride (0.03%) | 9 | 1200 | 202 |

As is clear from Table 4, when the cleaning agent of the present invention containing the nonionic surfactant and the quaternary ammonium compound (Example 8) is used, the number of particles adsorbed on a surface of the thermal oxidized wafer surfaces is 30 and that on a surface of the copper-deposited wafer is 5, and thus the cleaning agent is found to have excellent effect of removing particles.

On the contrary, when the cleaning agent containing the cationic surfactant and the quaternary ammonium compound (Control example 6), the number of particles adsorbed on a surface of the thermal oxidized wafer surfaces is 1200 and that on a surface of the copper-deposited wafer is 202, and thus the control cleaning agent is found to have poor effect of removing particles.

Example 7

In ultra-pure water were dissolved 3% of ammonia and 0.05% of a nonionic surfactant, 1,4-diisobutyl-1,4-dimethylbut-2-yn diol polyoxyethylene glycol ether of the formula [6] (the average mole number of oxyethylene group, [p+p']: 4) to give a cleaning agent of pH 11 or more. In the obtained cleaning agent was dipped the copper-deposited wafer obtained as above at room temperature (25° C.) for 30 minutes. The wafer was taken out, rinsed with ultra-pure water for 10 minutes and spin-dried.

Example 8

The copper-deposited wafer was treated by the same way as in Example 7 except for using a cleaning agent (pH 10) wherein 3% of diethanolamine and 0.05% of a nonionic surfactant, 1,4-diisobutyl-1,4-dimethylbut-2-yn diol polyoxypropylene glycol ether of the formula [8]:

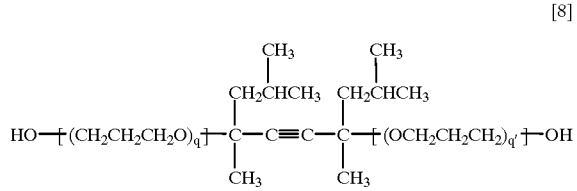

[8]

(the average mole number of oxyethylene group, [q+q']: 4 were dissolved in ultra-pure water.

As explained above in details, the present invention can provide a cleaning agent and a method for cleaning for a semi-conductor substrate, particularly one having copper wirings on its surface, which can remove impurities adsorbed on a surface of the substrate without causing corrosion or oxidation of wirings nor causing roughness on the surface, and various problems encountered with cleaning process for a semi-conductor can be solved by the present invention.

What is claimed is:

1. A method for cleaning a semi-conductor substrate having copper wirings on its surface, comprising treating a surface of a semi-conductor substrate having copper wirings on its surface with a cleaning agent comprising a compound shown by the general formula (2'):

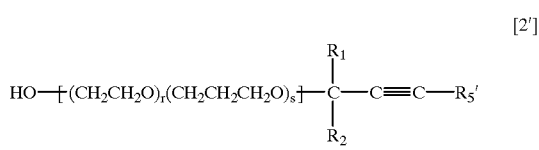

[2']

(wherein $R_1$ and $R_2$ are each independently a hydrogen atom, a hydroxy group, an alkyl group or a hydroxyalkyl group, r and s are each independently 0 or a positive integer, and $R_5$ is a hydrogen atom, a hydroxy group, an alkyl group, a hydroxyalkyl group or a group of the general formula (3'):

[3']

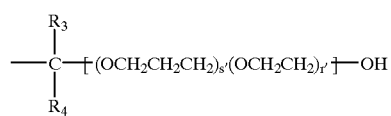

in which $R_3$ and $R_4$ are each independently a hydrogen atom, a hydroxy group, an alkyl group or a hydroxyalkyl group, and r' and s' are each independently 0 or a positive integer, except for a case where r and s are 0 and a case where r' and s' are 0) and an N-containing alkaline substance.

* * * * *